United States Patent
Manger

(10) Patent No.: US 7,339,224 B2
(45) Date of Patent: Mar. 4, 2008

(54) TRENCH CAPACITOR AND CORRESPONDING METHOD OF PRODUCTION

(75) Inventor: Dirk Manger, Dresden (DE)

(73) Assignee: Infineon Technologies AG, Munich (DE)

( * ) Notice: Subject to any disclaimer, the term of this patent is extended or adjusted under 35 U.S.C. 154(b) by 158 days.

(21) Appl. No.: 10/482,154

(22) PCT Filed: Jun. 12, 2002

(86) PCT No.: PCT/EP02/06462

§ 371 (c)(1),
(2), (4) Date: Jul. 12, 2004

(87) PCT Pub. No.: WO03/003462

PCT Pub. Date: Jan. 9, 2003

(65) Prior Publication Data

US 2004/0245558 A1    Dec. 9, 2004

(30) Foreign Application Priority Data

Jun. 27, 2001    (DE) ................ 101 30 934

(51) Int. Cl.
*H01L 29/94* (2006.01)

(52) U.S. Cl. ............... 257/301; 257/304; 257/305; 257/309; 257/E21.651; 257/E21.396; 257/E27.092

(58) Field of Classification Search ........... 257/301, 257/309, 304, 516, 61; 438/43, 486, 386, 438/247, 246

See application file for complete search history.

(56) References Cited

U.S. PATENT DOCUMENTS

| | | | |
|---|---|---|---|
| 4,952,524 A | * | 8/1990 | Lee et al. .............. 438/437 |
| 5,541,454 A | | 7/1996 | Inoue et al. |
| 5,640,041 A | * | 6/1997 | Lur et al. .............. 257/510 |
| 5,753,526 A | * | 5/1998 | Ozaki .................. 438/246 |
| 5,903,040 A | * | 5/1999 | Hong .................. 257/510 |
| 6,069,049 A | | 5/2000 | Geiss et al. |
| 6,258,689 B1 | * | 7/2001 | Bronner et al. ........ 438/386 |
| 2002/0135007 A1 | * | 9/2002 | Koike et al. .......... 257/301 |

FOREIGN PATENT DOCUMENTS

| | | | |
|---|---|---|---|
| EP | 0 981 164 A2 | | 7/1999 |
| EP | 0 981 158 A2 | | 2/2000 |
| JP | 07335750 | * | 12/1995 |
| WO | WO 01/17014 A1 | | 3/2001 |

OTHER PUBLICATIONS

S. Nakamura et al., "Aluminum Word Line and Bit Line Fabrication Technology for COB DRAM Using a Polysilicon-Aluminum Substitute," Symposium on VLSI Technology Digest of Technical Papers, Jun. 14, 1999.

* cited by examiner

*Primary Examiner*—Sue A. Purvis
*Assistant Examiner*—Fazli Erdem
(74) *Attorney, Agent, or Firm*—Eschweiler & Associates, LLC

(57) ABSTRACT

The invention relates to a trench capacitor, in particular for use in a semiconductor memory cell, comprising a trench (2), embodied in a substrate (1), a first region (1*a*), provided in the substrate (1), as first capacitor electrode, a dielectric layer (10) on the trench wall as capacitor dielectric and a metallic filler material (30") provided in the trench (2) as second electrode. Above the conducting metallic filling material (30") a dielectric filling material (35) is provided in the trench (2) with a cavity (40) provided for mechanical tensions. The invention further relates to a corresponding method of production.

5 Claims, 8 Drawing Sheets

TRENCH CAPACITOR AND CORRESPONDING METHOD OF PRODUCTION

CLAIM FOR PRIORITY

This application claims priority to PCT/EP02/06462, published in the German language on Jun. 12, 2002, which claims the benefit of priority to German Application No. 101 30 934.1, filed in the German language on Jun. 27, 2001.

TECHNICAL FIELD OF THE INVENTION

The present invention relates to a trench capacitor and a corresponding method of production.

BACKGROUND OF THE INVENTION

A trench capacitor is disclosed in EP 0 981 164 A2.

U.S. Pat. No. 5,541,454 A discloses the production of a semiconductor device with an electrostatic capacitive element.

Nakamura S. et al.: "Aluminum word line and bit line fabrication technology for cob dram using a polysilicon-aluminum substitute", 1999 Symposium on VLSI Technology, Digest of Technical Papers, Kyoto, Jun. 14-16, 1999, Symposium on VLSI Technology, New York, N.Y.: IEEE, US, pages 35-36, discloses the production of an aluminum word line with a low resistance.

WO 01/17014 A1 discloses a memory cell arrangement with trench capacitors and a method for the production thereof, a capacitor electrode being formed as a metallic electrode.

Integrated circuits (ICs) or chips use capacitors for the purpose of storing charge. One example of an IC which uses capacitors to store charges is a memory IC, such as e.g. a chip for a dynamic random access memory (DRAM). The charge state ("0" or "1") in the capacitor represents a data bit in this case.

A DRAM chip contains a matrix of memory cells which are connected up in the form of rows and columns. The row connections are usually referred to as word lines and the column connections as bit lines. The reading of data from the memory cells for the writing of data to the memory cells is realized by activating suitable word lines and bit lines.

A DRAM memory cell usually contains a transistor connected to a capacitor. The transistor contains two diffusion regions separated by a channel above which a gate is arranged. Depending on the direction of the current flow, one diffusion region is referred to as the drain and the other as the source. The designations "drain" and "source" are used mutually interchangeably here with regard to the diffusion regions. The gates are connected to a word line, and one of the diffusion regions is connected to a bit line. The other diffusion region is connected to the capacitor. The application of a suitable voltage to the gate switches the transistor on and enables a current flow between the diffusion regions through the channel in order thus to form a connection between the capacitor and the bit line. The switching-off of the transistor disconnects this connection by interrupting the current flow through the channel.

The charge stored in the capacitor decreases with time on account of an inherent leakage current. Before the charge has decreased to an indefinite level (below a threshold value), the storage capacitor must be refreshed.

Ongoing endeavors to reduce the size of storage devices foster the design of DRAMs having a greater density and a smaller characteristic size, that is to say a smaller memory cell area. In order to produce memory cells which occupy a smaller surface region, smaller components, for example capacitors, are used. However, the use of smaller capacitors results in a reduced storage capacitance, which, in turn, can adversely affect the functionality and usability of the storage device. For example, sense amplifiers require a sufficient signal level for reliable read-out of the information in the memory cells. The ratio of the storage capacitance to the bit line capacitance is critical in determining the signal level. If the storage capacitance becomes too small, this ratio may be too small to generate a sufficient signal. Likewise, a smaller storage capacitance requires a higher refresh frequency.

One type of capacitor usually used in DRAMs is a trench capacitor. A trench capacitor has a three-dimensional structure formed in the silicon substrate. An increase in the volume or the capacitance of the trench capacitor can be achieved by etching more deeply into the substrate. In this case, the increase in the capacitance of the trench capacitor does not have the effect of enlarging the surface occupied by the memory cell.

A customary trench capacitor contains a trench etched into the substrate. This trench is typically filled with $p^+$- or $n^+$-doped polysilicon, which serves as one capacitor electrode (also referred to as storage capacitor). The second capacitor electrode is the substrate or a "buried plate". A capacitor dielectric, containing e.g. nitride, is usually used to insulate the two capacitor electrodes.

A dielectric collar (preferably an oxide region) is produced in the upper region of the trench in order to prevent a leakage current or to insulate the upper part of the capacitor.

What has been of great interest recently is reducing the resistivity of the electrodes of such a trench capacitor, to be precise particularly if the relevant trench capacitor is used for producing a semiconductor memory. A reduced resistance, for example of the electrode situated in the trench, makes it possible to significantly relax the requirements made of the associated selection transistor. This applies particularly to DRAM generations with gate lengths of less than 90 nm.

Hitherto, the electrode situated in the trench has generally been formed by highly doped polysilicon having a good edge coverage of more than 90% and a mediocre resistivity of more than $500*10^{-6}$ Ω cm.

SUMMARY OF THE INVENTION

The present invention discloses an improved trench capacitor and a corresponding method of production with a reduced electrode resistance.

In one embodiment of the invention, the electrode is situated in the trench being formed by means of a metal filling, in particular aluminum filling, which advantageously enables an edge covering of more than 100%. Thermal stresses which occur as a result of the different expansion coefficients of the metal and substrate are absorbed by a mechanical protection device in the form of a cavity provided in a dielectric filling above the electrode. The resistivity of the electrode situated in the trench can be reduced to typically $5*10^{-6}$ Ω cm through the use of a corresponding metal.

In accordance with one preferred embodiment, an insulation collar is formed in the upper region of the trench.

In accordance with a further preferred embodiment, the metallic filling material comprises aluminum.

In accordance with a further preferred embodiment, the capacitor dielectric comprises an AlN/SiN layer.

In accordance with a further preferred embodiment, a diffusion barrier layer for preventing an outdiffusion of the metallic filling material is provided above the region made of the dielectric filling material.

In accordance with a further preferred embodiment, the region made of the metallic filling material can be electrically connected via a conductive contact layer on the trench walls in the upper trench region.

In accordance with a further preferred embodiment, the metallic filling material region is formed as capacitor electrode in the following manner by deposition of a layer made of the metallic filling material above the trench and melting down and etching back of the layer.

In accordance with a further preferred embodiment, the cavity is formed by a deposition of the dielectric material with low edge coverage.

In accordance with a further preferred embodiment, a wetting layer is deposited before the layer made of the metallic filling material is deposited.

BRIEF DESCRIPTION OF THE DRAWINGS

An exemplary embodiment of the present invention is illustrated in the drawings and is explained in more detail in the description below.

In the figures.

DETAILED DESCRIPTION OF THE INVENTION

Although applicable to any desired trench capacitors, the present invention and the problem area on which it is based are explained below with regard to a trench capacitor used in a DRAM memory cell.

FIGS. 1*a-f* show the method steps for producing an exemplary embodiment of the trench capacitor according to the invention.

Figure 1:
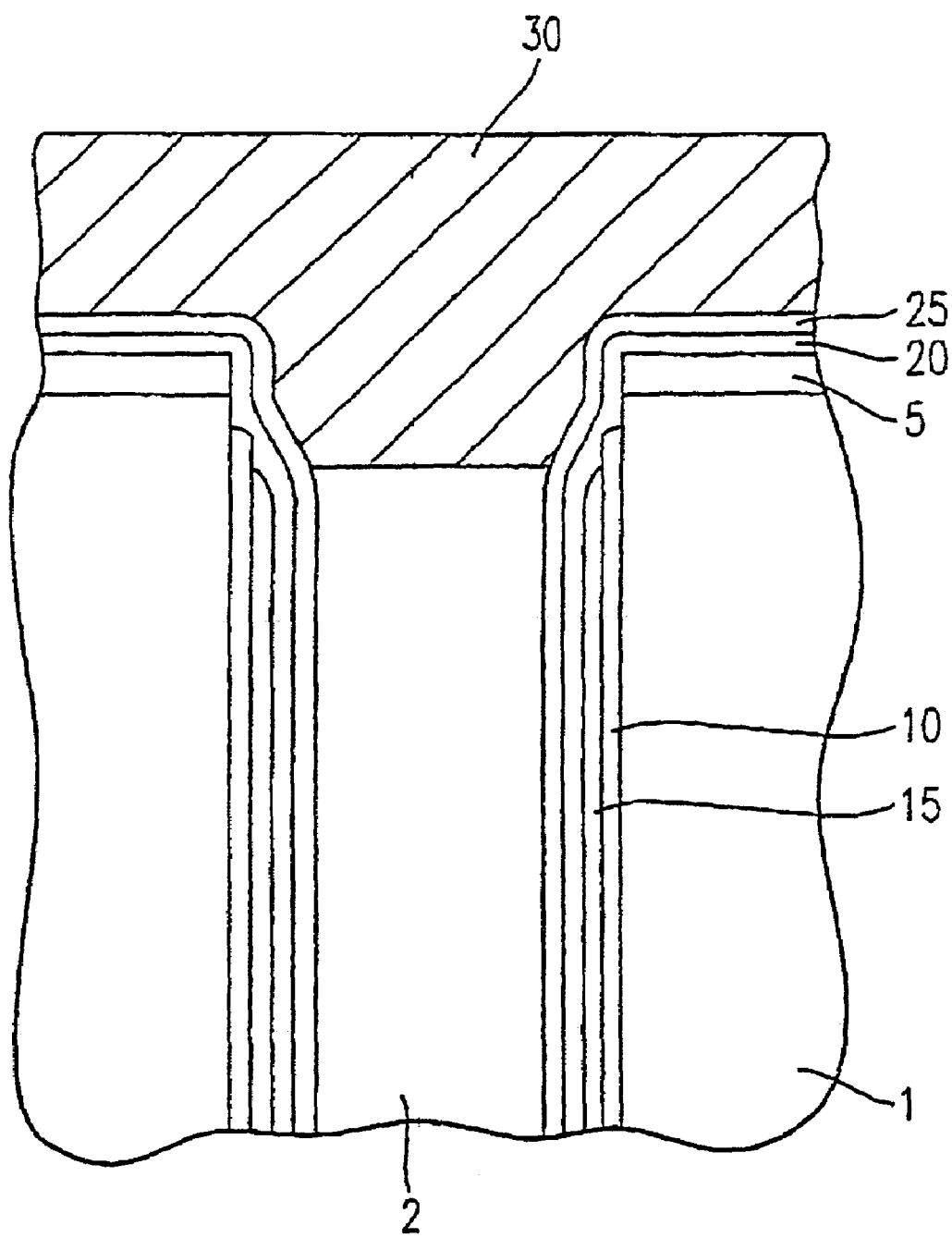
FIGS. 1-8 show the method for producing an exemplary embodiment of the trench capacitor according to the invention.

In FIG. 1, 1 designates a silicon substrate. A trench 2 is formed in the silicon substrate 1 in a known manner by means of an etching process, a pad nitride layer 5 being used as a protective layer affording protection against mechanical and chemical attack of the silicon substrate during subsequent process steps.

Afterward, an insulation collar 15 e.g. made of silicon oxide is formed in a known manner in the upper trench region. A barrier layer 10 or a node dielectric made of AlN/SiN is then formed, likewise in a known manner, at the trench walls.

In a subsequent process step, a low-impedance contact layer 20 is deposited on the resulting structure which comprises $TaSi_x$ or Ta, for example. The edge coverage of the process generally does not suffice to produce a low-impedance electrode on the entire length of the trench 2. Aluminum metal will later dissolve silicon from TaSi at high temperatures, but the resulting Al-Ta compounds are thermostable.

In a further process step, a thin wetting layer 25 made of TiN, polysilicon or germanium is deposited with good edge coverage. This wetting layer 25 may be consumed during later temperature cycles, as is explained further below.

In a next process step, a metal layer 30 made of aluminum is deposited over the resulting structure. This process step may have a poor edge coverage, but the layer thickness of the metal layer 30 made of aluminum must suffice to fill the entire trench 2 during a subsequent process step.

Figure 2A:
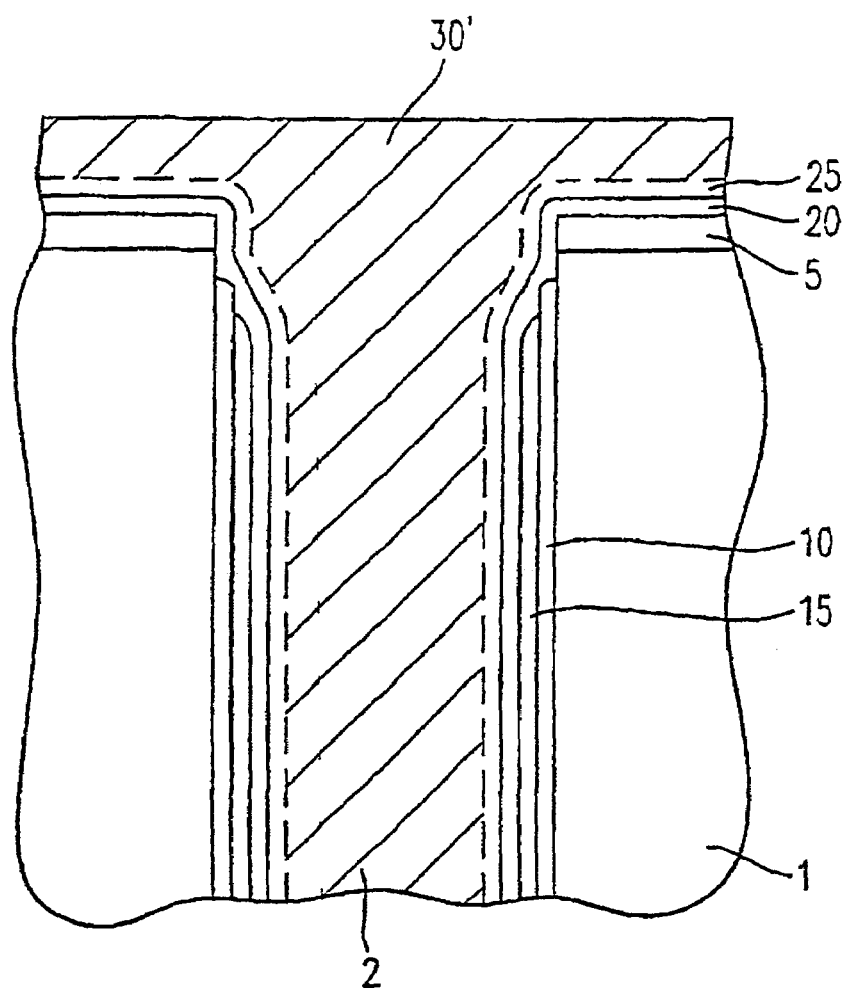
Figure 2B:
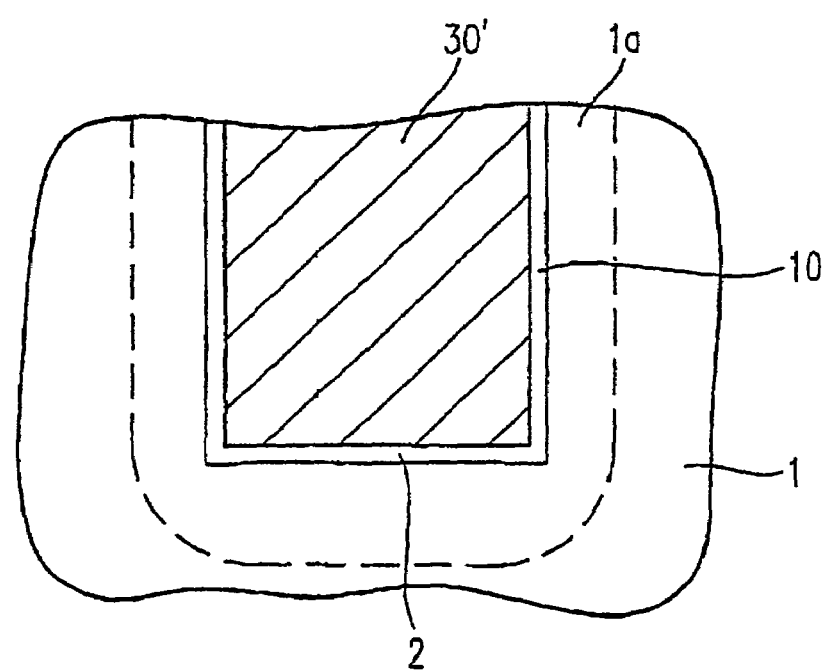

With reference to FIGS. 2*a, b*, the structure is then heated to approximately 600° C., as a result of which the aluminum of the metal layer 30 is completely melted down into the trench 2, which leads to a modified metal layer 30'. In this connection, FIG. 2*a* shows the upper trench region and FIG. 2*b* the lower trench region. FIG. 2*b* likewise reveals a region 1*a*, provided in the substrate 1, as first capacitor electrode (buried plate).

The wetting layer 25 is consumed during this process, as indicated by the broken line in FIG. 2*a*. If the wetting layer 25 comprises polysilicon or germanium, the aluminum of the metal layer 30 is driven into the trench 2 since aluminum and silicon form a eutectic alloy with a reduced melting point. The polysilicon or germanium is alloyed into the aluminum in this case. In the case of a wetting layer 25 made of TiN, the good wetting of the TiN surface with aluminum is exploited, which enables the aluminum metal to be driven into the trench 2. The TiN may be dissolved in the aluminum in subsequent process steps.

Figure 3:
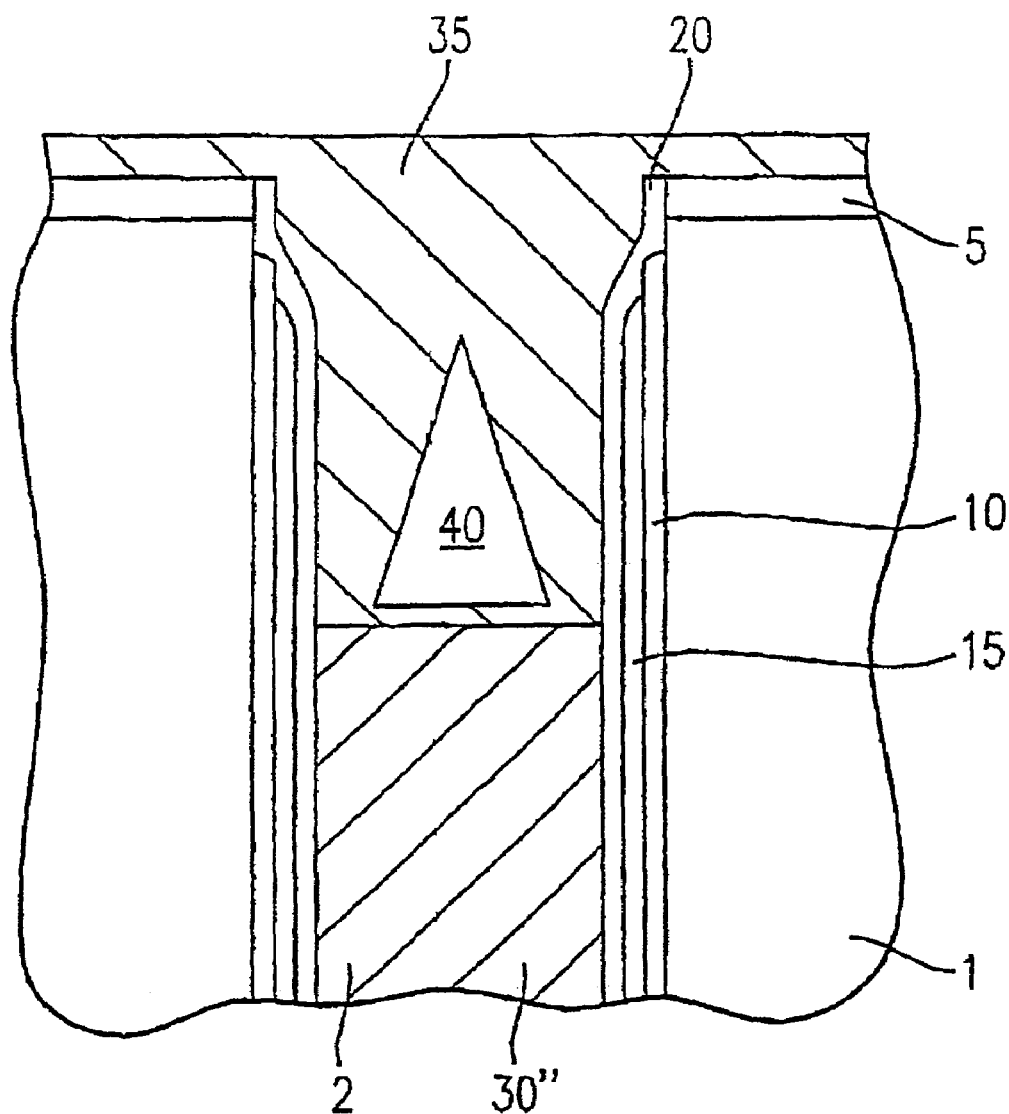

With reference to FIG. 3, the aluminum is then firstly etched back in order to form an aluminum electrode 30" in the trench 2. The etching back of aluminum may be effected wet-chemically using $H_3PO_4$ (11.8 mol per liter)—$HNO_3$ (0.6 mol per liter) selectively with respect to the contact layer 20 made of $TaSi_x$ or Ta. Plasma etching using HBr plasma is also possible in this connection.

In a subsequent process step, a dielectric layer 35 is deposited over the resulting structure. The dielectric layer 35 may comprise SiO2 or SiN, for example. A deposition process with low edge coverage is used during this deposition, as a result of which a cavity 40 is formed above the aluminum electrode 30". Said cavity 40 serves as an expansion space if, during later temperature cycles, the aluminum metal expands to a greater extent than the surrounding substrate 1 or the layers situated thereon. The formation of the cavity 40 prevents the production of thermal stresses which might lead to defects of the structure.

Figure 4:
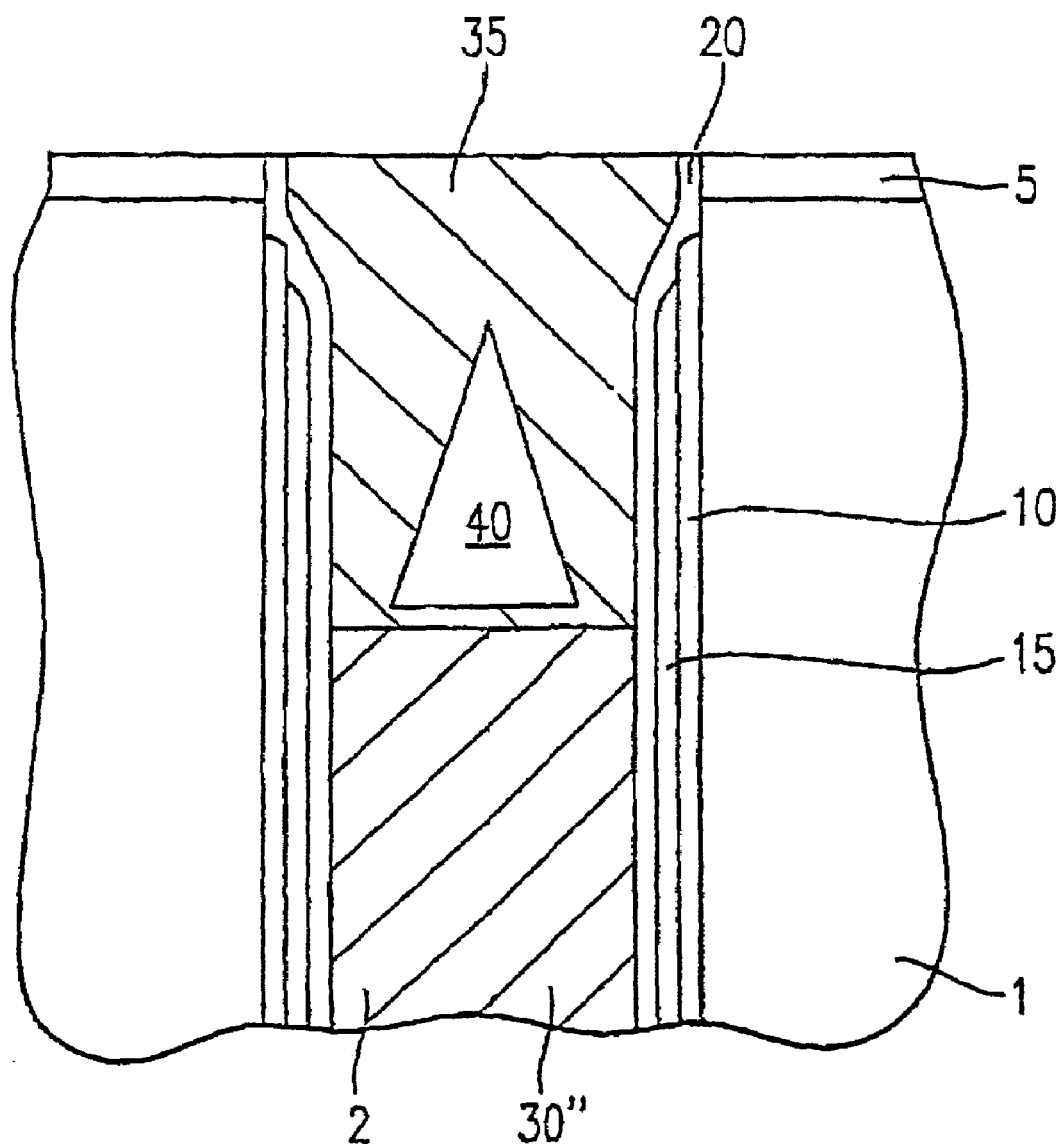

With reference to FIG. 4, the dielectric layer 35 and the contact layer 20 are polished back from the surface of the structure by means of a chemical mechanical polishing step, the pad nitride 5 serving as a polishing stop.

Figure 5:
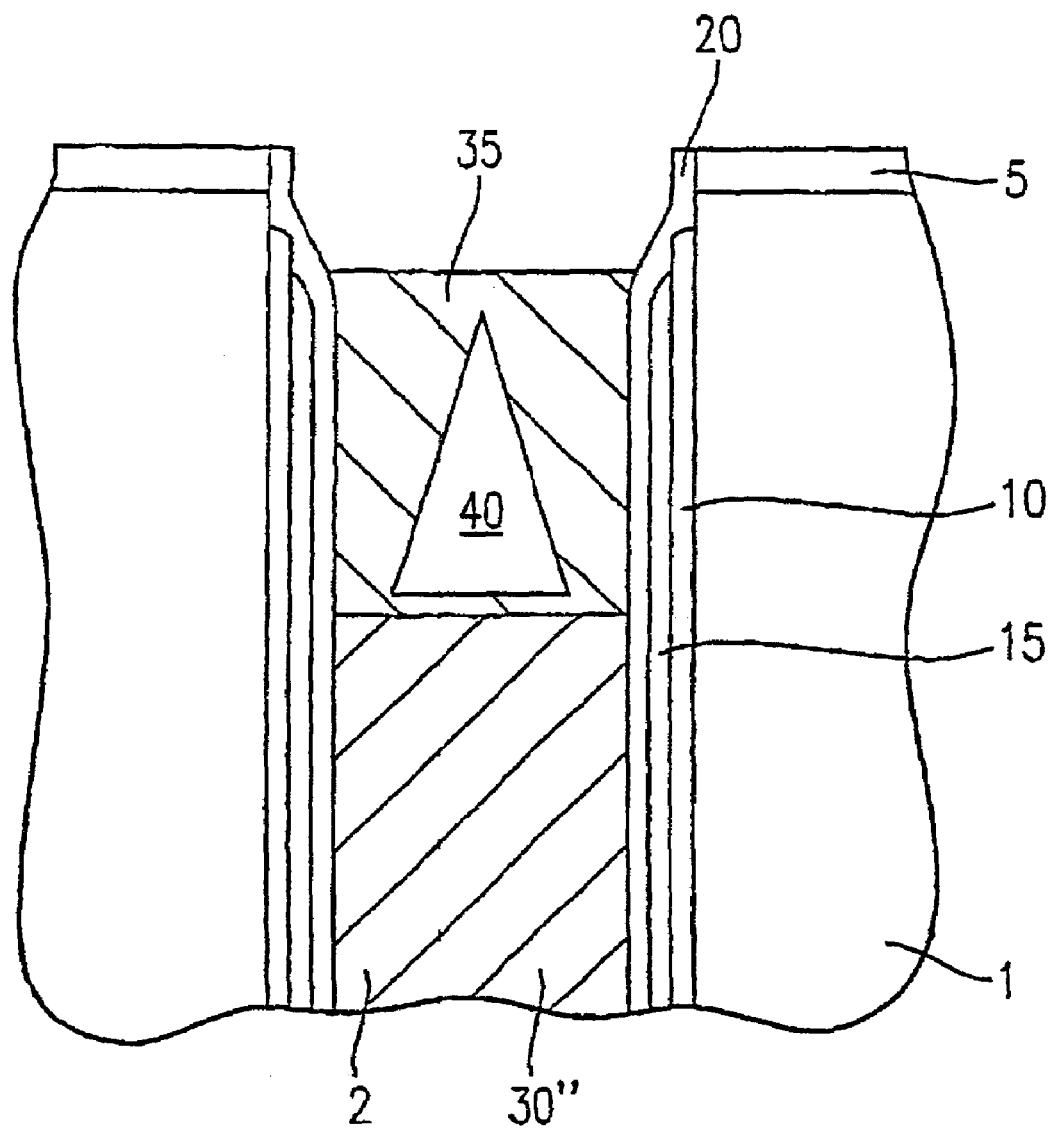

With reference to FIG. 5, the dielectric layer 35 is then etched selectively to below the end of the insulation collar 15.

Figure 6:
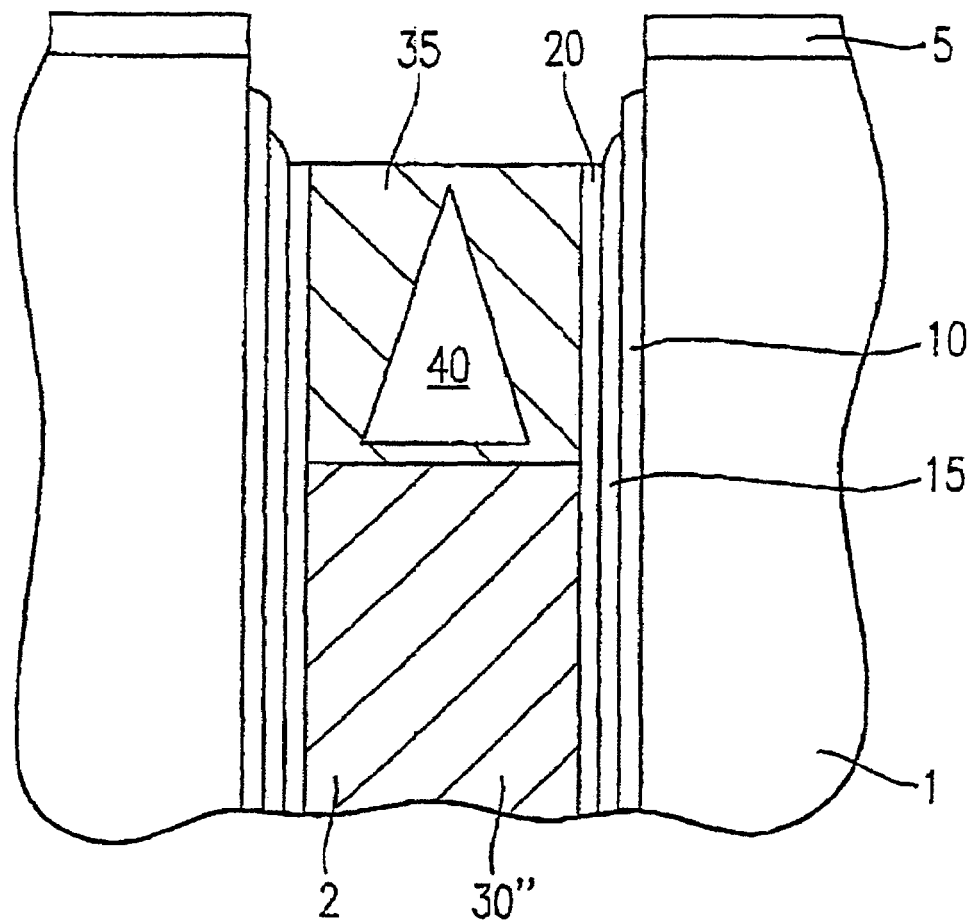

In a subsequent process step in accordance with FIG. 6, the contact layer 20 and the barrier layer 10, which simultaneously serves as capacitor dielectric, are etched back selectively with respect to the oxide likewise as far as the start of the dielectric layer 35.

Figure 7:
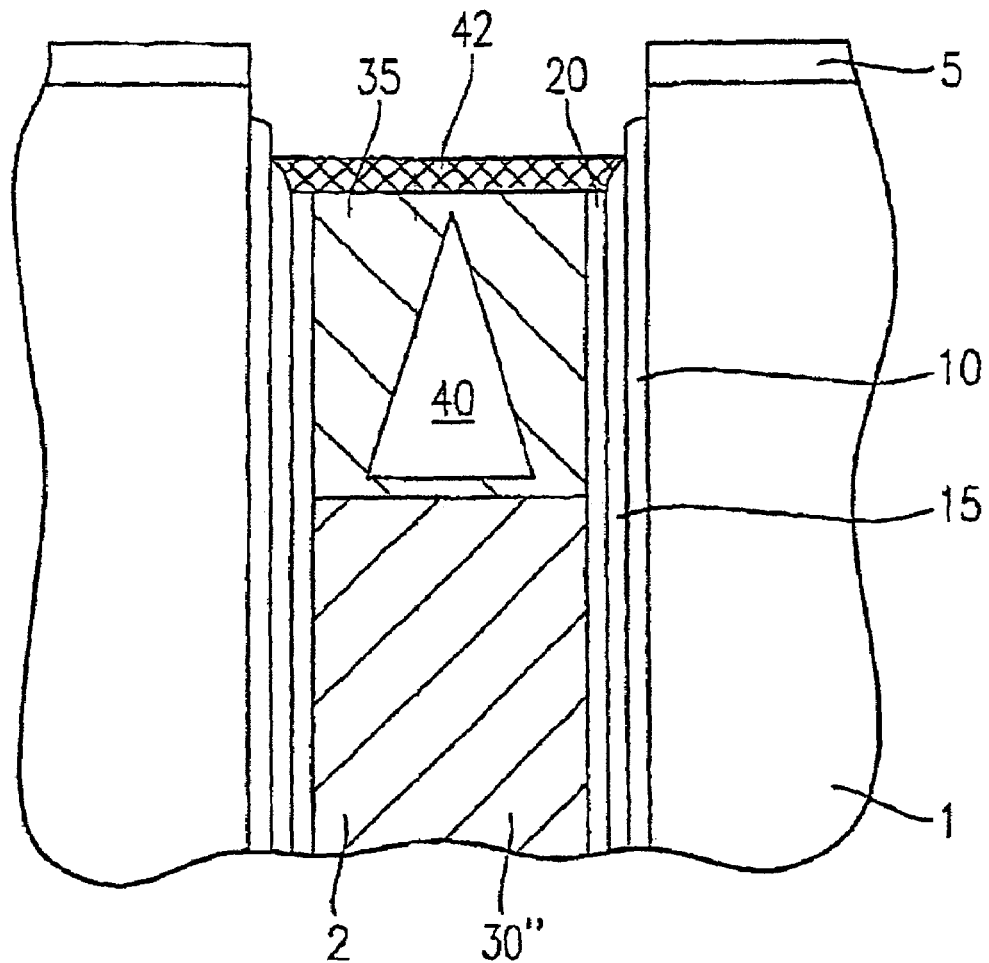

As shown in FIG. 7, TaSi is then deposited and etched back by means of a process step with poor edge coverage, thereby forming a conductive diffusion barrier 42 above the dielectric layer 35, which laterally has a contact with the contact layer 20.

The dielectric material can be sunk even further by means of a further etching of the insulation collar 15.

Figure 8:
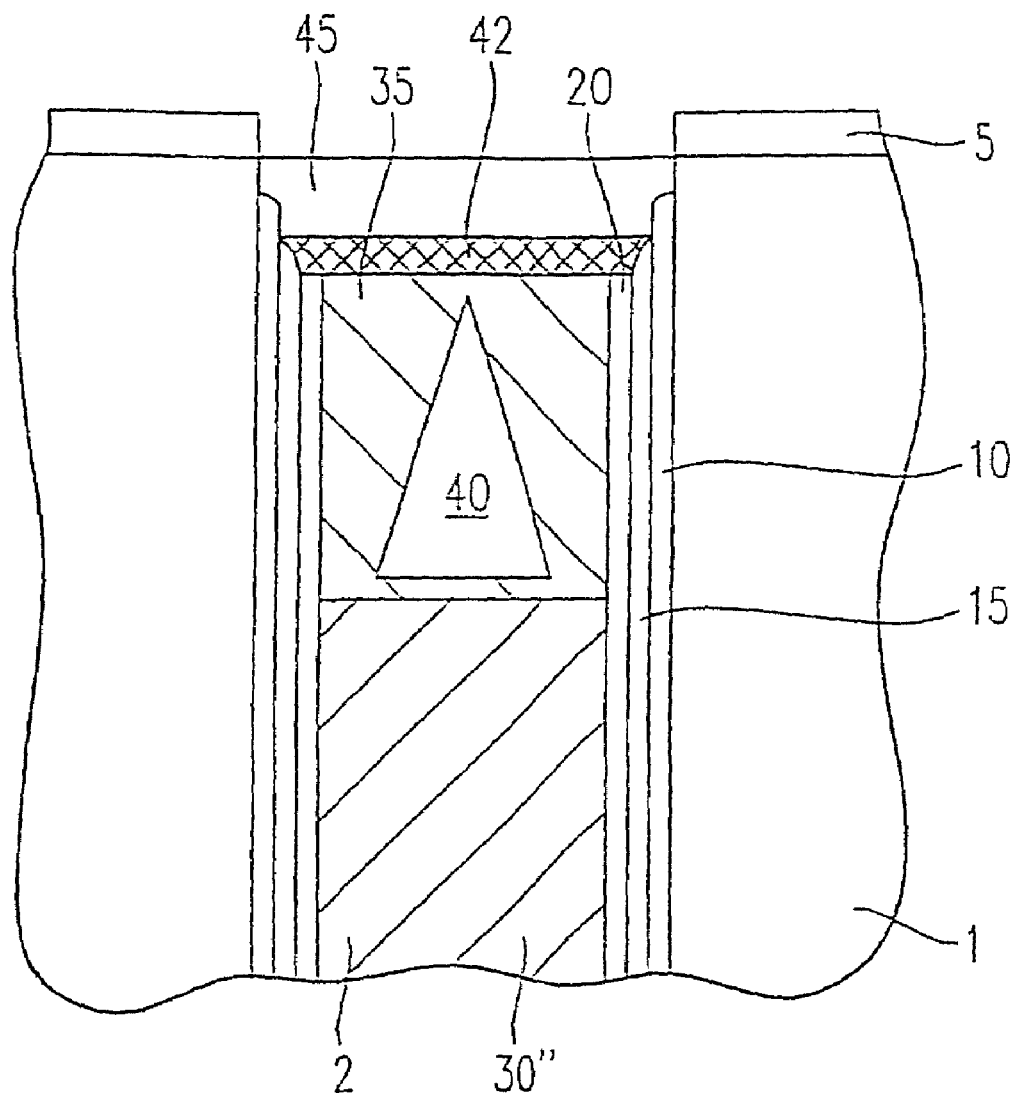

Finally, with reference to FIG. 8, the uncovered sidewall of the silicon substrate 1 is sealed by means of nitriding (not illustrated in FIG. 8 for reasons of clarity) and highly doped polysilicon 45 is deposited and etched back in order to form a contact with respect to the metal electrode 30" situated in the trench.

The further course of the process, in particular the formation of the corresponding selection transistor in the case of a use in a memory cell array, are well known in the prior art.

Although the present invention has been described above on the basis of a preferred exemplary embodiment, it is not restricted thereto, but rather can be modified in diverse ways.

In particular, the materials cited are only by way of example and can be replaced by other materials with suitable properties. The same applies to the etching processes and deposition processes mentioned.

Moreover, the melting down of the aluminum as shown is only an example and could also be realized by means of the PAS process wherein polysilicon and aluminum are interdiffused. In this respect, see "Aluminium word line and bit line fabrication technology for COB DRAM using a polysilicon-aluminum substitute" from Nakamura et al., 1999 Symposium on VLSI Technology, Digest of Technical Papers (IEEE Cat. No. 99CH36325.

LIST OF REFERENCE SYMBOLS

| | |
|---|---|
| 1 | Silicon substrate |
| 1a | Substrate electrode |
| 2 | Trench |
| 5 | Pad nitride |
| 10 | AlN/SiN as barrier or node dielectric |
| 15 | Insulation collar |
| 20 | Contact layer |
| 25 | Wetting layer |
| 30, 30' | Metal layer, e.g. made of aluminum |
| 30" | Metal electrode, e.g. made of aluminum |
| 35 | Dielectric layer |
| 40 | Cavity |
| 42 | Conductive barrier layer |
| 45 | Polysilicon layer |

The invention claimed is:

1. A trench capacitor for use in a semiconductor memory cell, comprising:

a trench, which is formed in a substrate;

a region, provided in the substrate, as first capacitor electrode;

a dielectric layer on the trench wall as capacitor dielectric; and a region, provided in the trench, made of a metallic filling material as second capacitor electrode, wherein the region made of the conductive metallic filling material fills the lower region of the trench, above the region made of the conductive metallic filling material, a region made of a dielectric filling material with a cavity for taking up mechanical stresses fills an upper region of the trench; and the region made of the metallic filling material is connected via a conductive contact layer on the trench walls, which is applied above the dielectric layer, to an electrical contact provided above the region made of the dielectric filling material in the trench for the electrical connection of the trench capacitor.

2. The trench capacitor as claimed in claim 1, wherein an insulation collar is formed in the upper region of the trench.

3. The trench capacitor as claimed in claim 1, wherein the metallic filling material comprises aluminum.

4. The trench capacitor as claimed in claim 1, wherein the capacitor dielectric comprises an A1N and/or an SiN layer.

5. The trench capacitor as claimed in claim 1, wherein a diffusion barrier layer for preventing an outdiffusion of the metallic filling material is provided above the region made of the dielectric filling material.

* * * * *